(12) United States Patent
Kim et al.

(10) Patent No.: US 11,074,974 B2
(45) Date of Patent: Jul. 27, 2021

(54) MEMORY DEVICE AND METHOD OF OPERATING THE SAME

(71) Applicant: SK hynix Inc., Gyeonggi-do (KR)

(72) Inventors: Jong Woo Kim, Gyeonggi-do (KR); Young Cheol Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/883,351

(22) Filed: May 26, 2020

(65) Prior Publication Data

US 2021/0174873 A1 Jun. 10, 2021

(30) Foreign Application Priority Data

Dec. 5, 2019 (KR) .................. 10-2019-0160871

(51) Int. Cl.
*G11C 16/04* (2006.01)
*G11C 16/32* (2006.01)
*G11C 16/30* (2006.01)
*G11C 16/26* (2006.01)
*G11C 16/08* (2006.01)
*G11C 16/10* (2006.01)
*G11C 7/10* (2006.01)

(52) U.S. Cl.
CPC ........ *G11C 16/0425* (2013.01); *G11C 7/1048* (2013.01); *G11C 16/08* (2013.01); *G11C 16/10* (2013.01); *G11C 16/26* (2013.01); *G11C 16/30* (2013.01); *G11C 16/32* (2013.01)

(58) Field of Classification Search
CPC ..... G11C 16/0425; G11C 16/30; G11C 16/26; G11C 16/32; G11C 7/1048; G11C 16/10; G11C 16/08

See application file for complete search history.

(56) References Cited

U.S. PATENT DOCUMENTS 10,714,205 B1 * 7/2020 Fang ................. G11C 29/028
10,951,133 B2 * 3/2021 Schaler .............. H02N 1/002
2020/0411073 A1 * 12/2020 Hwang ............ G11C 11/5628

FOREIGN PATENT DOCUMENTS

KR 10-2002-0047770 6/2002
KR 10-2010-0106767 10/2010

* cited by examiner

*Primary Examiner* — Gene N Auduong
(74) *Attorney, Agent, or Firm* — IP & T Group LLP

(57) ABSTRACT

The present disclosure relates to an electronic device and a method of operating a memory device having a reduced program operation time including pre-charging a select line connected to the select transistor to a first select voltage during a first time period, discharging the select line during a second time period subsequent to the first time period, and discharging the select line while word lines connected to the plurality of memory cells are pre-charged to an operation voltage in a third time period subsequent to the second time period to change a level of the first select voltage pre-charged to the select line to a second select voltage.

20 Claims, 16 Drawing Sheets

FIG. 8A
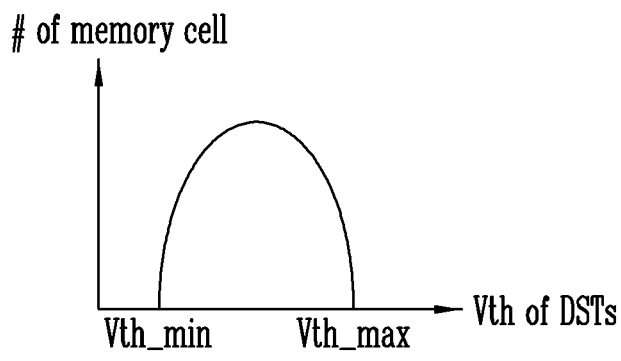
THRESHOLD VOLTAGE DISTRIBUTION OF DST
FIG. 8B
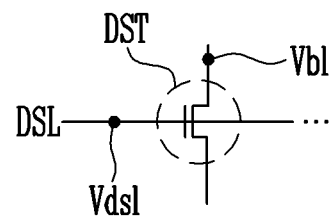
VOLTAGE APPLIED TO DST
FIG. 9
| OPERATION MODE | TURN ON/OFF CONDITION OF DST |
|---|---|
| program mode | Vdsl − Vbl(0V) > Vth_max |
| program inhibit mode | Vdsl − Vbl(Vcc) < Vth_min |
| Vdsl window | Vth_max < Vdsl < Vth_min + Vcc |

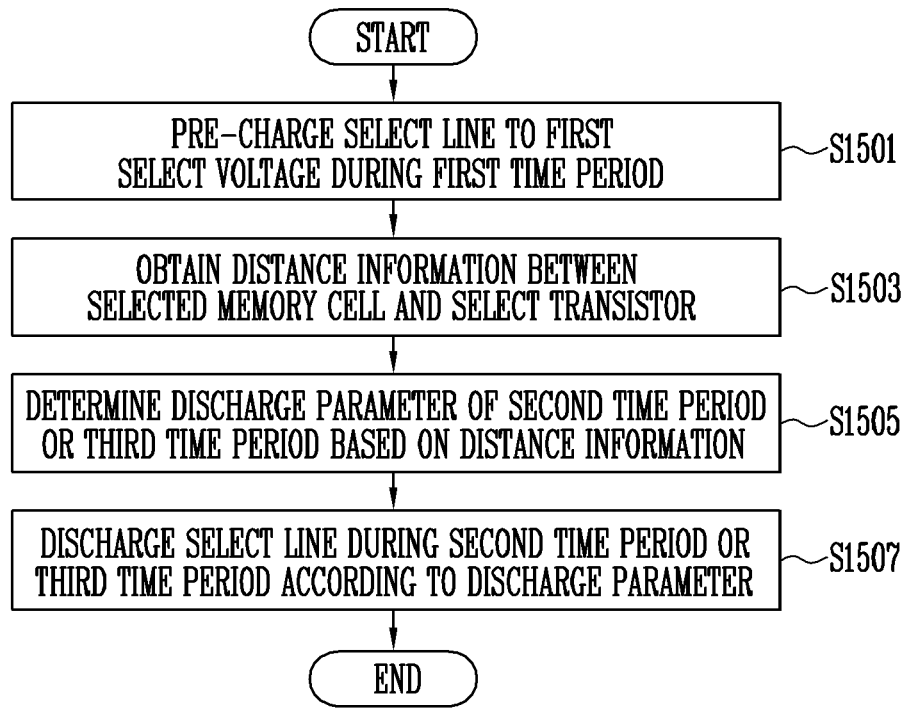
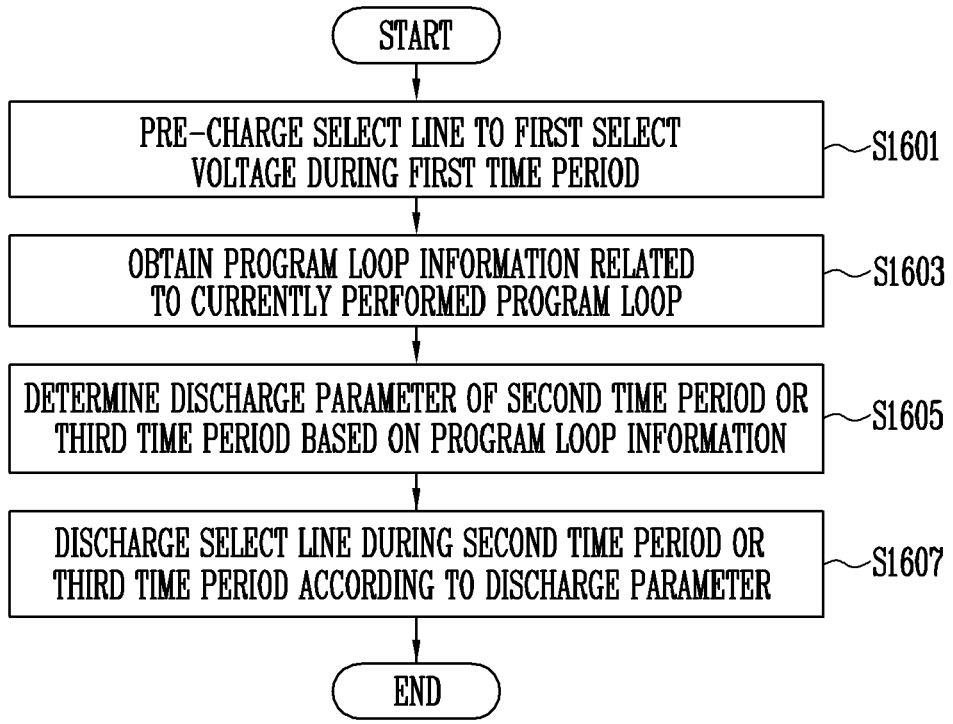

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0160871, filed on Dec. 5, 2019, which is incorporated herein by reference in its entirety.

BACKGROUND

Field of Invention

The present disclosure relates to an electronic device, and more particularly, to a memory device and a method of operating the same.

Description of Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

A volatile memory device is a device that stores data only when power is supplied and loses the stored data when the power supply is cut off. Examples of volatile memory devices include a static random-access memory (SRAM), a dynamic random-access memory (DRAM), and the like.

A non-volatile memory device is a device that does not lose data even though power is cut off. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

Various embodiments of the present disclosure provide a memory device having channel boosting performance and a method of operating the same.

A method of operating a memory device according to an embodiment of the present disclosure includes pre-charging a select line connected to the select transistor to a first select voltage during a first time period, discharging the select line during a second time period subsequent to the first time period, and discharging the select line while word lines connected to the plurality of memory cells are pre-charged to an operation voltage in a third time period subsequent to the second time period to change a level of a select voltage pre-charged to the select line to a second select voltage.

A memory device according to an embodiment of the present disclosure includes a cell string including a select transistor and a plurality of memory cells, a peripheral circuit configured to perform a program operation on a selected memory cell among the plurality of memory cells, and a control logic configured to control the peripheral circuit so that a select line connected to the select transistor is discharged while a word line connected to the plurality of memory cells is pre-charged to an operation voltage during the program operation.

A method of operating a memory device according to an embodiment of the present disclosure includes pre-charging a select line coupled to the select transistor to a first level, discharging after the pre-charging the select line to be within a range, and adjusting after the discharging a voltage level of the select line to a second level by discharging the select line while pre-charging word lines coupled to the memory cells, wherein the range depends on a threshold voltage of the select transistor and a program inhibit voltage applied to a bit line coupled to the cell string.

An embodiment of the present disclosure provides a memory device having improved channel boosting performance and a method of operating the same.

BRIEF DESCRIPTION OF THE DRAWINGS

FIG. 8A is a diagram for describing a threshold voltage distribution of the drain select transistors connected to the drain select line.

FIG. 8B is a diagram for describing a voltage applied to each terminal of the drain select transistor.

FIG. 9 is a diagram for describing a method of calculating a select voltage window.

FIG. 15 is a flowchart for describing a method of determining a discharge parameter according to an embodiment of the present disclosure.

FIG. 16 is a flowchart for describing the method of determining the discharge parameter according to an embodiment of the present disclosure.

DETAILED DESCRIPTION

Figure 1:
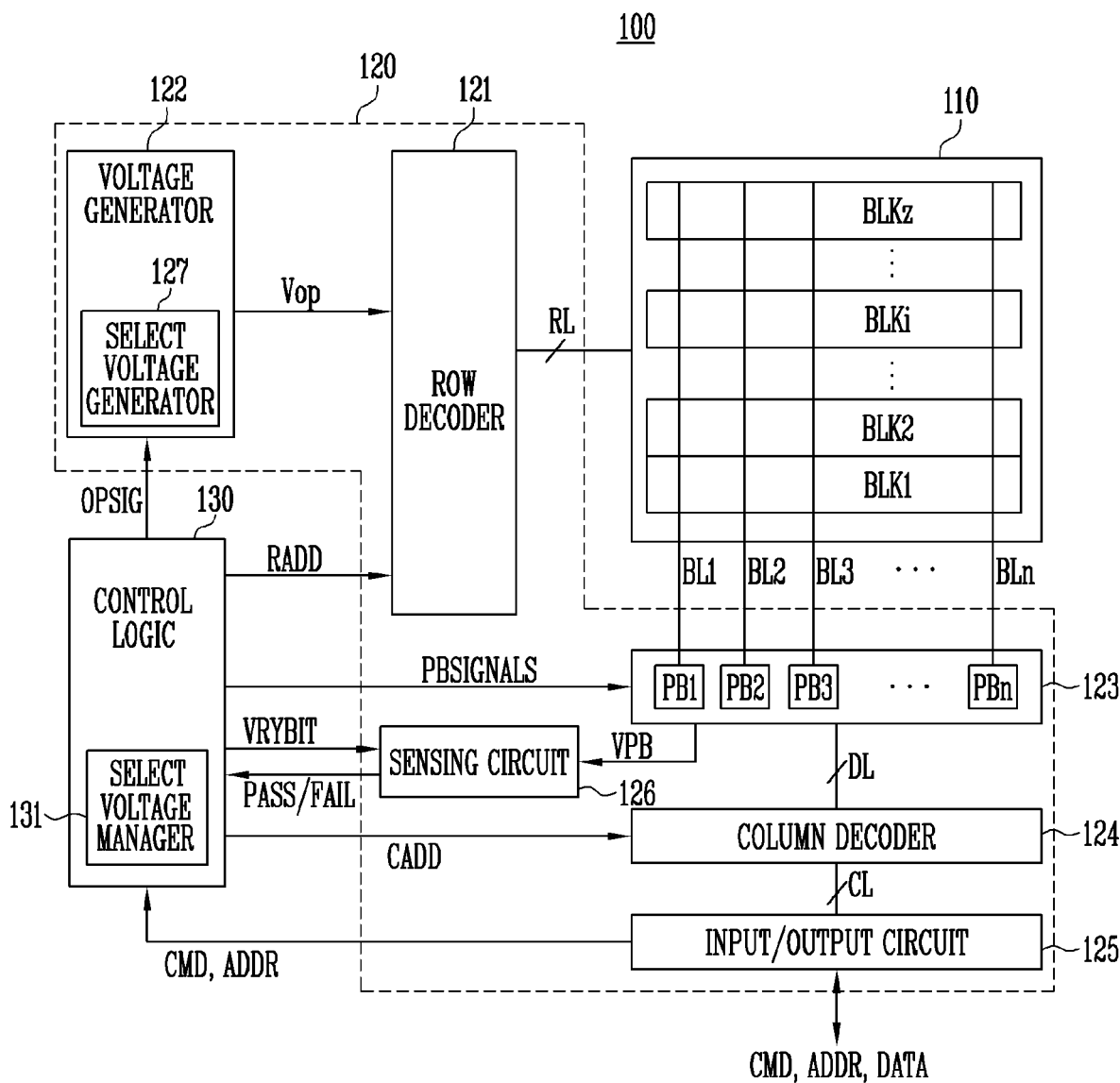
FIG. 1 is a diagram for describing a memory device.

FIG. 1 is a diagram for describing a memory device.

Referring to FIG. 1, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The memory blocks BLK1 to BLKz may be connected to a page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to a word line may be defined as a page. Thus, one memory block may include a plurality of pages.

The row lines RL may include at least one source select line SSL, a plurality of word lines, and at least one drain select line DSL.

Each of the memory cells included in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to the control of the control logic 130. The row decoder 121 receives a row address RADD from the control logic 130.

The row decoder 121 is configured to decode the row address RADD. The row decoder 121 selects at least one memory block among the memory blocks BLK1 to BLKz according to a decoded address. In addition, the row decoder 121 may select at least one word line of the memory block according to the decoded address to apply voltages generated by the voltage generator 122.

For example, during the program operation, the row decoder 121 may apply a program voltage to a selected word line and apply a program pass voltage of a level lower than that of the program voltage to unselected word lines. During a program verification, the row decoder 121 may apply a verify voltage to the selected word line and apply a verify pass voltage higher than the verify voltage to the unselected word lines. During the read operation, the row decoder 121 may apply a read voltage to the selected word line and apply a read pass voltage higher than the read voltage to the unselected word lines.

In an embodiment, the erase operation of the memory cell array 110 is performed in a memory block unit. During the erase operation, the row decoder 121 may select one memory block according to the decoded address. During the erase operation, the row decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

As an embodiment, the voltage generator 122 may generate an internal power voltage by regulating an external power voltage. The internal power voltage generated by the voltage generator 122 is used as an operation voltage of the memory cell array 110.

As an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

In an embodiment, the voltage generator 122 may include a select voltage generator 127. The select voltage generator 127 may generate a select voltage in response to control of a select voltage manager 131. The select voltage may be a voltage applied to the drain select line of the row line RL.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read operation or the program verification.

Specifically, during the program operation, when a program pulse is applied to the selected word line, the first to n-th page buffers PB1 to PBn may transfer data DATA, which is received through the data input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program inhibit voltage (for example, the power voltage) is applied may be maintained. During the program verification, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines DL or may exchange data with the input/output circuit 125 through column lines CL.

The input/output circuit 125 may transfer the command CMD and the address ADDR received from the memory controller to the control logic 130, or may exchange the data DATA with the column decoder 124.

The sensing circuit 126 may generate a reference current in response to a permission bit signal VRYBIT during the read operation or the program verification, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit signal VRYBIT in response to the command CMD and the address ADDR to control the peripheral circuit 120. In addition, the control logic 130 may determine whether the program verification is passed or failed in response to the pass or fail signal PASS or FAIL.

In an embodiment, the control logic 130 may include the select voltage manager 131. The select voltage manager 131 may control the select voltage generator 127 to discharge the select voltage applied to the drain select line during a predetermined time period determined based on a timing at which the operation voltage is applied to the word line.

Figure 2:
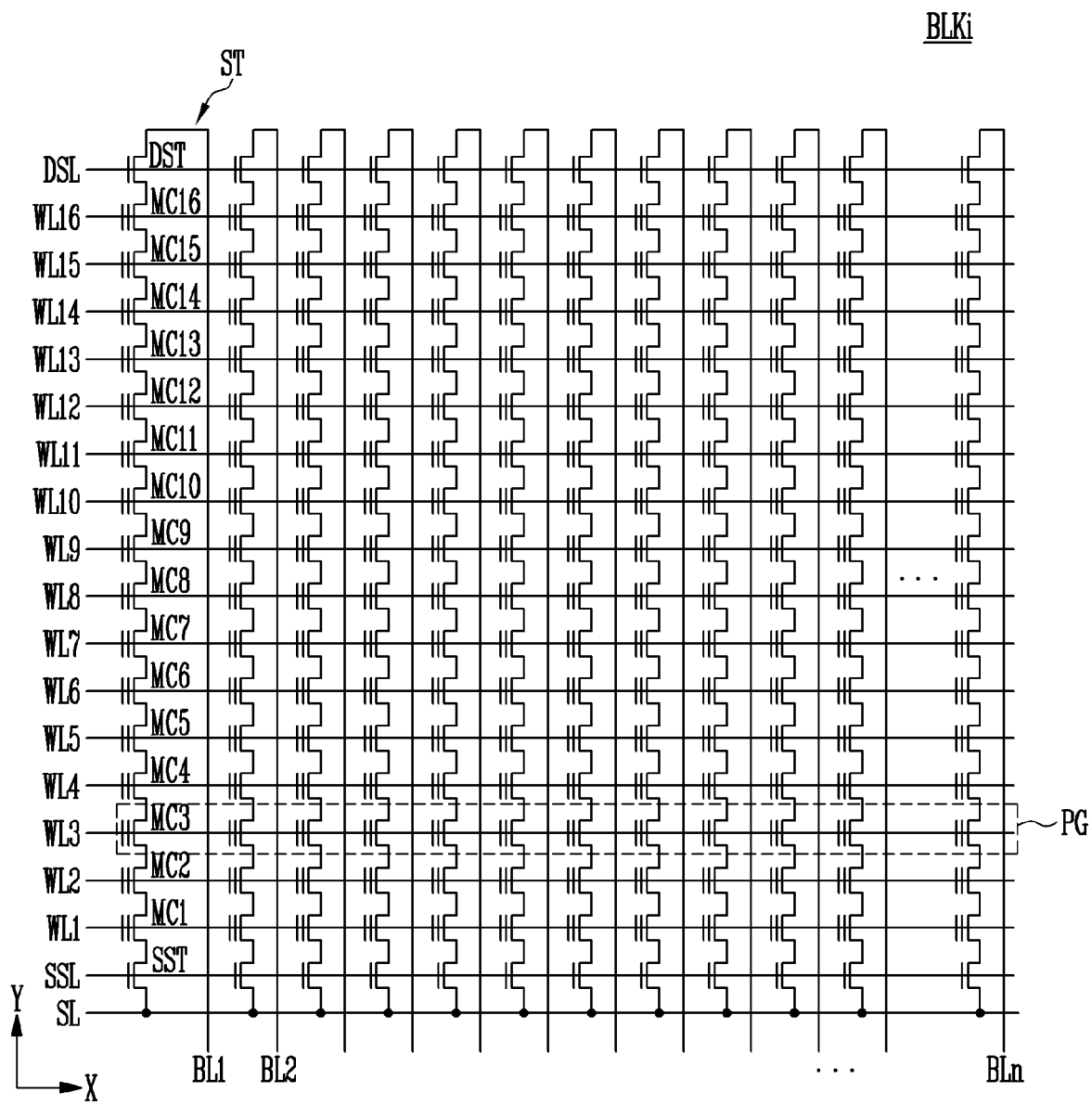
FIG. 2 is a diagram for describing a memory block BLKi of FIG. 1.

FIG. 2 is a diagram for describing a memory block BLKi of FIG. 1.

Referring to FIG. 2, a plurality of word lines arranged in parallel to each other between a first select line and a second select line may be connected to the memory block BLKi. Here, the first select line may be a source select line SSL, and the second select line may be a drain select line DSL. More specifically, the memory block BLKi may include a plurality of strings ST connected between the bit lines BL1 to BLn and a source line SL. The bit lines BL1 to BLn may be connected to the strings ST, respectively, and the source line SL may be commonly connected to the strings ST. Since the strings ST may be configured identically to each other, the string ST connected to the first bit line BL1 will be specifically described as an example.

The string ST may include a source select transistor SST, a plurality of memory cells MC1 to MC16, and a drain select transistor DST connected in series between the source line SL and the first bit line BL1. One string ST may include at least one source select transistor SST and at least one drain select transistor DST, and may include a number of memory cells greater than the number of memory cells MC1 to MC16 shown in the drawing.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of the source select transistors SST included in different strings ST may be connected to the source select line SSL, gates of the drain select transistors DST may be connected to the drain select line DSL, and gates of the memory cells MC1 to MC16 may be connected to a plurality of word lines WL1 to WL16. A group of memory cells connected to the same word line among memory cells included in different strings ST may be referred to as a physical page PG. Therefore, the memory block BLKi may include as many physical pages PG as the number of word lines WL1 to WL16.

One memory cell may store 1 bit of data. This is commonly called a single level cell (SLC). In this case, one physical page PG may store one logical page (LPG) data. The one logical page (LPG) data may include as many data bits as the number of cells included in one physical page (PG). In addition, one memory cell may store two or more bits of data. In this case, one physical page (PG) may store two or more logical page (LPG) data.

Figure 3:
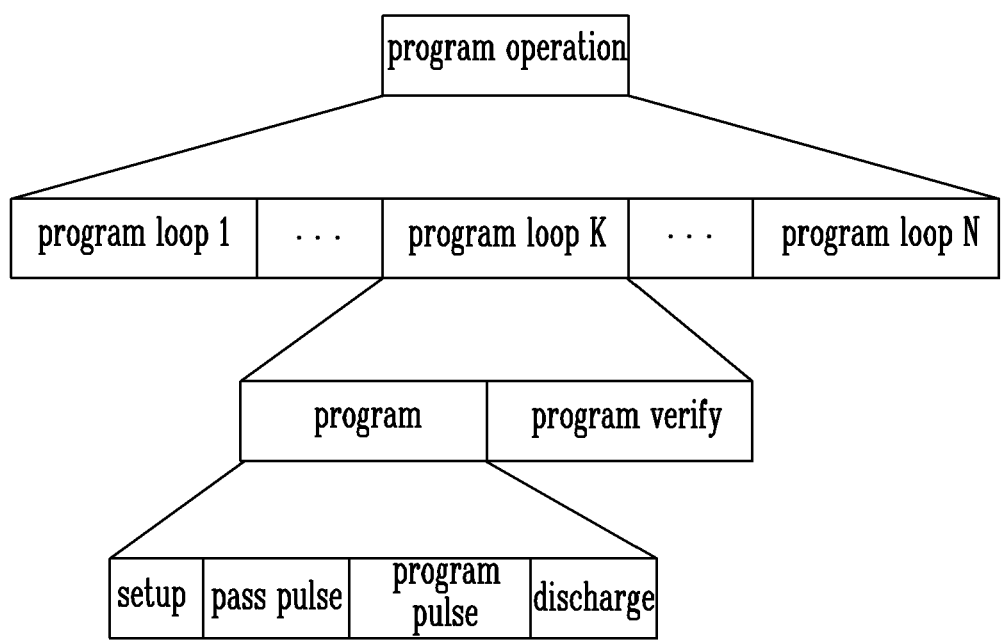
FIG. 3 is a diagram for describing a program operation.

FIG. 3 is a diagram for describing the program operation.

Referring to FIG. 3, the program operation may include a plurality of program loops. For example, the program operation may include a first program loop 1 to an N-th program loop N.

The program loop may include a program period and a program verify period.

The program period may be a period in which data is programmed in the selected memory cell. The program period may include a setup period, a pass pulse period, a program pulse period, and a discharge period.

In a setup period, a bit line connected to a string including the selected memory cell may be pre-charged to a program permission voltage, and a bit line connected to a string including an unselected memory cell may be pre-charged to a program inhibit voltage. The selected memory cell may be a memory cell to be programmed, and the unselected memory cell may be a memory cell that is not to be programmed. The string including the selected memory cell may be defined as a selected string. The string including the unselected memory cell may be defined as an unselected string. The program permission voltage may be a ground (GND) voltage, and the program inhibit voltage may be a power voltage Vcc. In the setup period, a select voltage may be applied to the drain select line.

When the program permission voltage is applied to the bit line and the select voltage is applied to the drain select line, the drain select transistor may be turned on. Therefore, the selected string may not be floated. The selected string may be pre-charged according to the program permission voltage applied to the bit line.

When the program inhibit voltage is applied to the bit line and the select voltage is applied to the drain select line, the drain select transistor may be turned off. Therefore, the unselected strings may be floated. A channel potential of the unselected string may increase by the select voltage. For example, the channel potential of the unselected string may increase to a level lower from the select voltage by a threshold voltage of the drain select transistor.

In the pass pulse period, a pass voltage may be applied to a word line connected to the unselected memory cell. In an embodiment, the pass voltage may be applied to a word line connected to the selected memory cell. The word line connected to the unselected memory cell may be defined as an unselected word line. The word line connected to the selected memory cell may be defined as a selected word line.

When the pass voltage is applied to the word line, the memory cells included in the select string may be turned on. Since a channel of the unselected string is floated, when the pass voltage is applied to the word line, the channel potential of the unselected string may increase. For example, the channel potential of the unselected cell string may increase in proportion to the pass voltage and a capacitive coupling ratio (CCR).

In the program pulse period, the program voltage may be applied to the selected word line. When the program voltage is applied to the selected word line, the selected memory cell included in the select string among the memory cells connected to the selected word line may be programmed. Since the channel of the unselected string is floated, when the program voltage is applied to the selected word line, the channel potential of the unselected string may increase. For example, the channel potential of the unselected cell string may increase in proportion to the program voltage and the capacitive coupling ratio (CCR). When a potential difference between the program voltage applied to the selected word line and the channel potential is equal to or greater than a reference value, the selected memory cell may be programmed. Since the channel potential of the unselected string increases simultaneously when the pass voltage and the program voltage are applied, the potential difference between the program voltage applied to the selected word line and the channel potential may be less than the reference value. Therefore, the memory cells included in the unselected string may not be programmed.

In the discharge period, the bit line and the word line may be discharged.

The program verify period may be a period for verifying programmed data. Specifically, the program verify period may be a period for applying a verify voltage to the selected word line and verifying whether the threshold voltage of the selected memory cell is greater than the verify voltage. When the threshold voltage of the selected memory cell is greater than the verify voltage, the selected memory cell may be in a program inhibit mode in the next program loop. That is, in the next program loop, the bit line electrically connected to the selected memory cell may be pre-charged to the program inhibit voltage. When the threshold voltage of the selected memory cell is less than or equal to the verify voltage, the selected memory cell may be in a program permission mode in the next program loop. That is, in the next program loop, the bit line electrically connected to the selected memory cell may be pre-charged to the program permission voltage.

Figure 4:
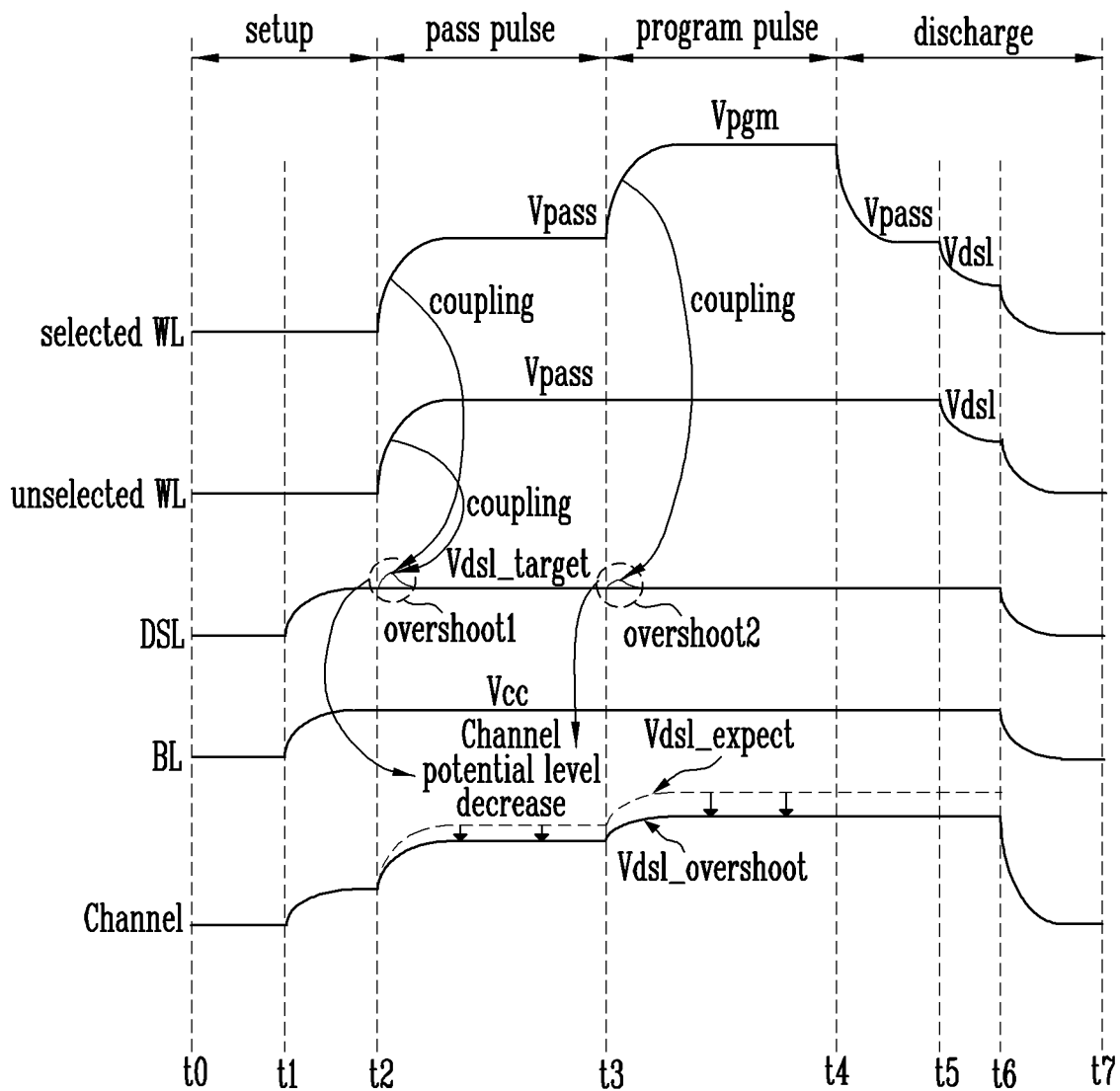
FIG. 4 is a timing diagram for describing a program period of a program inhibit mode in detail.

FIG. 4 is a timing diagram for describing the program period of the program inhibit mode in detail.

Referring to FIG. 4, the program period may be between a zero-th time t0 and a seventh time t7. The setup period may be between the zero-th time t0 and a second time t2. The pass pulse period may be between the second time t2 and a third time t3. The program pulse period may be between the third time t3 and a fourth time t4. The discharge period may be between the fourth time t4 and the seventh time t7.

At the first time t1, the bit line electrically connected to the memory cell of the program inhibit mode may be pre-charged to the program inhibit voltage. The program inhibit voltage may be the power voltage Vcc. At the first time t1, a target select voltage Vdsl_target may be applied to the drain select line DSL. The target select voltage Vdsl_target and the program permission voltage may be set to turn off the drain select transistor DST. When the drain select transistor DST is turned off, the channel formed in the cell string including the memory cell of the program inhibit mode may be floated. A potential of the floated channel may increase when an operation voltage is applied to the word line.

At the second time t2, a pass voltage Vpass may be applied to the word line. The pass voltage Vpass may be applied to the selected word line as well as the unselected word line. When the pass voltage Vpass is applied to the word line, a first overshoot overshoot1 may occur in the drain select line DSL due to coupling between the word line and the drain select line DSL. That is, a voltage applied to the drain select line DSL may temporarily increase. When the voltage applied to the drain select line DSL is greater than the target select voltage Vdsl_target, the drain select transistor DST may be turned on. When the drain select transistor DST is turned on, the channel potential of the unselected string may decrease.

At the third time t3, a program voltage Vpgm may be applied to the selected word line. When the program voltage Vpgm is applied to the selected word line, a second overshoot overshoot2 may occur in the drain select line DSL due to the coupling between the selected word line and the drain select line DSL. That is, the voltage applied to the drain select line DSL may temporarily increase. When the voltage applied to the drain select line DSL is greater than the target select voltage Vdsl_target, the drain select transistor DST may be turned on. When the drain select transistor DST is turned on, the channel potential of the unselected string may decrease.

That is, the channel potential may be an overshoot select voltage Vdsl_overshoot that is lowered from an expected select voltage Vdsl_expect by the first overshoot overshoot1 and the second overshoot overshoot2.

When the channel potential of the unselected string decreases, a program disturb in which the unselected memory cell is programmed may occur. Specifically, when the potential difference between the channel potential of the unselected string and the program voltage is greater than the reference value by the decrease of the channel potential of the unselected string, the program disturb may occur.

At the fourth time t4, the selected word line may be discharged so that the voltage applied to the selected word line becomes the pass voltage Vpass. At a fifth time t5, the selected word line and the unselected word line may be discharged so that the voltages applied to the selected word line and the unselected word line become the select voltage Vdsl. At a sixth time t6, the selected word line, the unselected word line, the drain select line, and the bit line may be discharged so that the voltages applied to the selected word line, the unselected word line, the drain select line, and the bit line become the ground voltage. The coupling due to the potential difference between the word lines and the coupling due to the potential difference between the word line and the drain select line may be released, by stepwise discharging the selected word line and the unselected word line.

Figure 5:
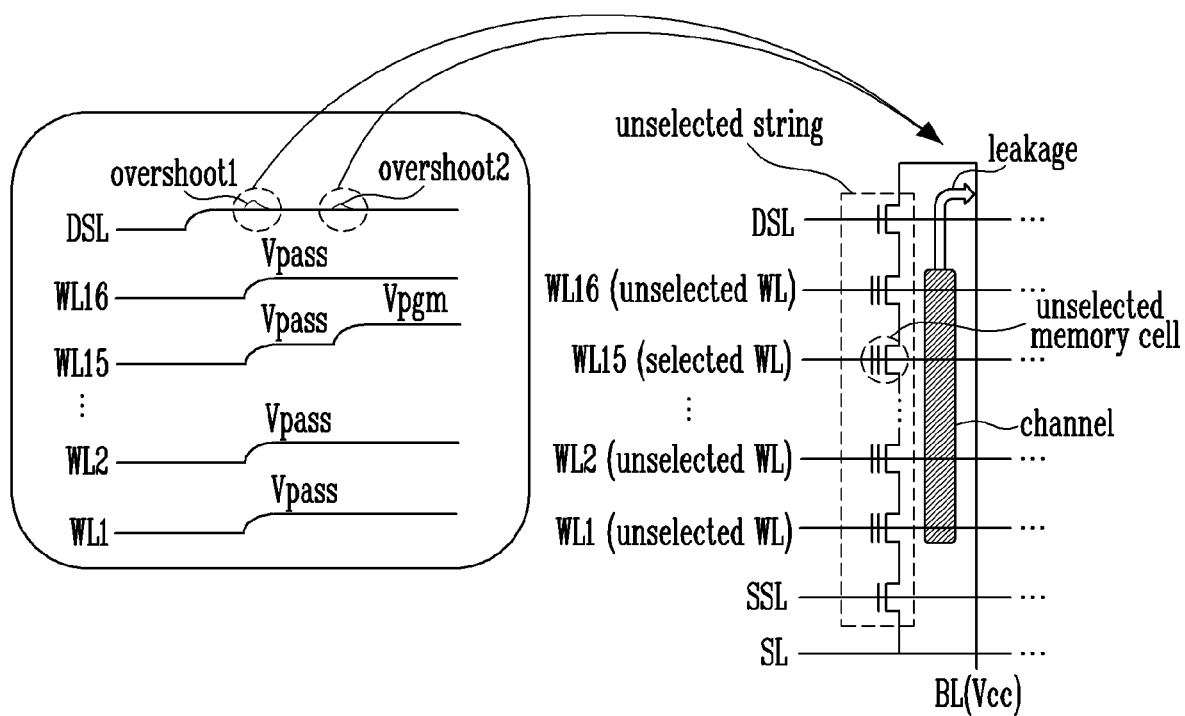
FIG. 5 is a diagram for describing a process of decreasing a channel potential.

FIG. 5 is a diagram for describing a process of decreasing the channel potential.

Referring to FIG. 5, the first overshoot overshoot1 and the second overshoot overshoot2 may occur in the drain select line DSL. The overshoot may be a phenomenon in which the voltage applied to the drain select line temporarily increases.

The overshoot of the drain select line may occur by the coupling between the drain select line and the word line. Specifically, when the pass voltage Vpass applied to the word line affects the drain select line, the first overshoot overshoot1 may occur. When the program voltage Vpgm applied to the selected word line affects the drain select line, the second overshoot overshoot2 may occur.

When the overshoot occurs, the channel potential of the unselected string may decrease. Specifically, when the overshoot occurs in the drain select line, the drain select transistor DST connected to the drain select line may be turned on. When the drain select transistor DST is turned on, a leakage current may occur from the channel of the unselected string including the memory cell of the program inhibit mode to the bit line. When the leakage current occurs, the channel potential of the unselected string may decrease. When the channel potential of the unselected string decreases, the program disturb in which the unselected memory cell is programmed may occur, when the program voltage Vpgm is applied to the selected word line.

Figure 6:
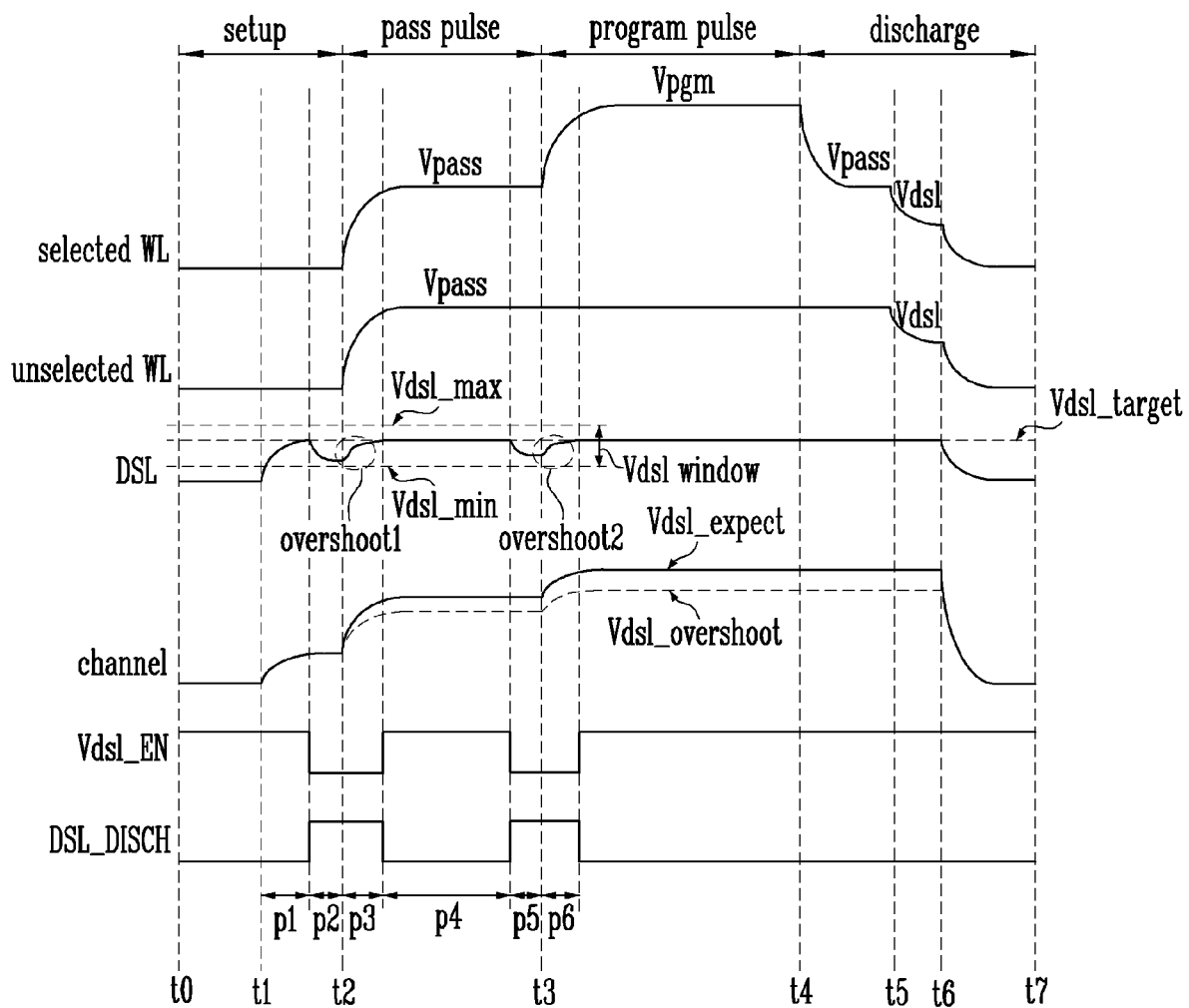
FIG. 6 is a timing diagram for describing a select voltage discharge according to an embodiment of the present disclosure.

FIG. 6 is a timing diagram for describing a select voltage discharge according to an embodiment.

Referring to FIG. 6, the select voltage manager 131 may generate a select line activation signal Vdsl_EN and a drain select line discharge signal DSL_DISCH, and transfer the select line activation signal Vdsl_EN and the select line discharge signal DSL_DISCH to the select voltage generator 127. The select voltage generator 127 may discharge the drain select line DSL in response to the select line activation signal Vdsl_EN and the drain select line discharge signal DSL_DISCH.

When the select line activation signal Vdsl_EN is activated, the select voltage may be applied to the drain select line DSL. When the select line activation signal Vdsl_EN is inactivated, the select voltage may not be applied to the drain select line DSL.

When the drain select line discharge signal DSL_DISCH is activated, the drain select line DSL may be discharged. That is, a level of the select voltage applied to the drain select line DSL may be lowered. When the drain select line discharge signal DSL_DISCH is inactivated, the drain select line DSL may not be discharged.

In the setup period, the drain select line DSL may be discharged. Specifically, when a first period p1 elapses from the first time t1 at which the select voltage is applied to the drain select line DSL, the drain select line DSL may be discharged.

In the setup period, the drain select line DSL may be discharged during a second period p2. Specifically, the select voltage applied to the drain select line DSL may decrease to a level higher than a minimum select voltage Vdsl_min. The select voltage manager 131 may control the select voltage generator 127 so that the select voltage is decreased to a level higher than the minimum select voltage Vdsl_min by adjusting a length of the second period p2 during which the drain select line discharge signal DSL_DISCH is activated.

The select voltage manager 131 may discharge the drain select line during a third period p3 subsequent to the second period p2. However, during the third period p3, the select voltage may increase by the pass voltage Vpass applied to the word line. That is, the select voltage may increase by the first overshoot overshoot1. The select voltage manager 131 may control the select voltage to increase to a level lower than a maximum select voltage Vdsl_max by adjusting a length of the third period p3 during which the drain select line discharge signal DSL_DISCH is activated. For example, the select voltage manager 131 may control the length of the third period p3 so that the select voltage reaches the target select voltage Vdsl_target by the overshoot.

When a fourth period p4 subsequent to the third period p3 elapses, the drain select line DSL may be discharged. That is, during a fifth period p5 subsequent to the fourth period p4, the drain select line DSL may be discharged. Specifically, the select voltage applied to the drain select line DSL may decrease to a level higher than the minimum select voltage Vdsl_min. The select voltage manager 131 may control the select voltage generator 127 so that the select voltage is decreased to a level higher than the minimum select voltage Vdsl_min by adjusting a length of the fifth period p5 during which the drain select line discharge signal DSL_DISCH is activated.

The select voltage manager 131 may discharge the drain select line during a sixth period p6 subsequent to the fifth period p5. However, during the sixth period p6, the select voltage may increase by the program voltage Vpgm applied to the word line. That is, the select voltage may increase by the second overshoot overshoot2. The select voltage manager 131 may control the select voltage to increase to a level lower than the maximum select voltage Vdsl_max by adjusting a length of the sixth period p6 during which the drain select line discharge signal DSL_DISCH is activated. For example, the select voltage manager 131 may control the length of the sixth period p6 so that the select voltage reaches the target select voltage Vdsl_target by the overshoot.

The select voltage manager 131 may control the select voltage not to be applied to the drain select line while the drain select line is discharged through the select line activation signal Vdsl_EN. For example, the select line activation signal Vdsl_EN may be inactivated when the drain select line discharge signal DSL_DISCH is activated, and the select line activation signal Vdsl_EN may be activated when the drain select line discharge signal DSL_DISCH is inactivated.

The select voltage manager 131 may control the select voltage applied to the drain select line in the pass pulse period and the program pulse period to be positioned in a select voltage window Vdsl window. The select voltage window may be a range of the select voltage set so that the channel potential of the unselected string is not decreased. That is, when a voltage included in the select voltage window is applied to the drain select line, the unselected string may be floated. The select voltage window Vdsl window may be in a range between the minimum select voltage Vdsl_min and the maximum select voltage Vdsl_max. A method of determining the select voltage window may be described with reference to FIG. 9. A final select voltage applied to the drain select line in the program pulse period may be the target select voltage Vdsl_target.

In accordance with an embodiment, the decrease of the channel potential may be prevented, despite the operation voltage applied to the word line, by discharging the drain select line before the drain select line DSL is overshot by the operation voltage applied to the word line. Therefore, even though the first overshoot overshoot1 and the second overshoot overshoot2 occur, the channel potential may be the expected select voltage Vdsl_expect rather than the overshoot select voltage Vdsl_overshoot.

Figure 7:
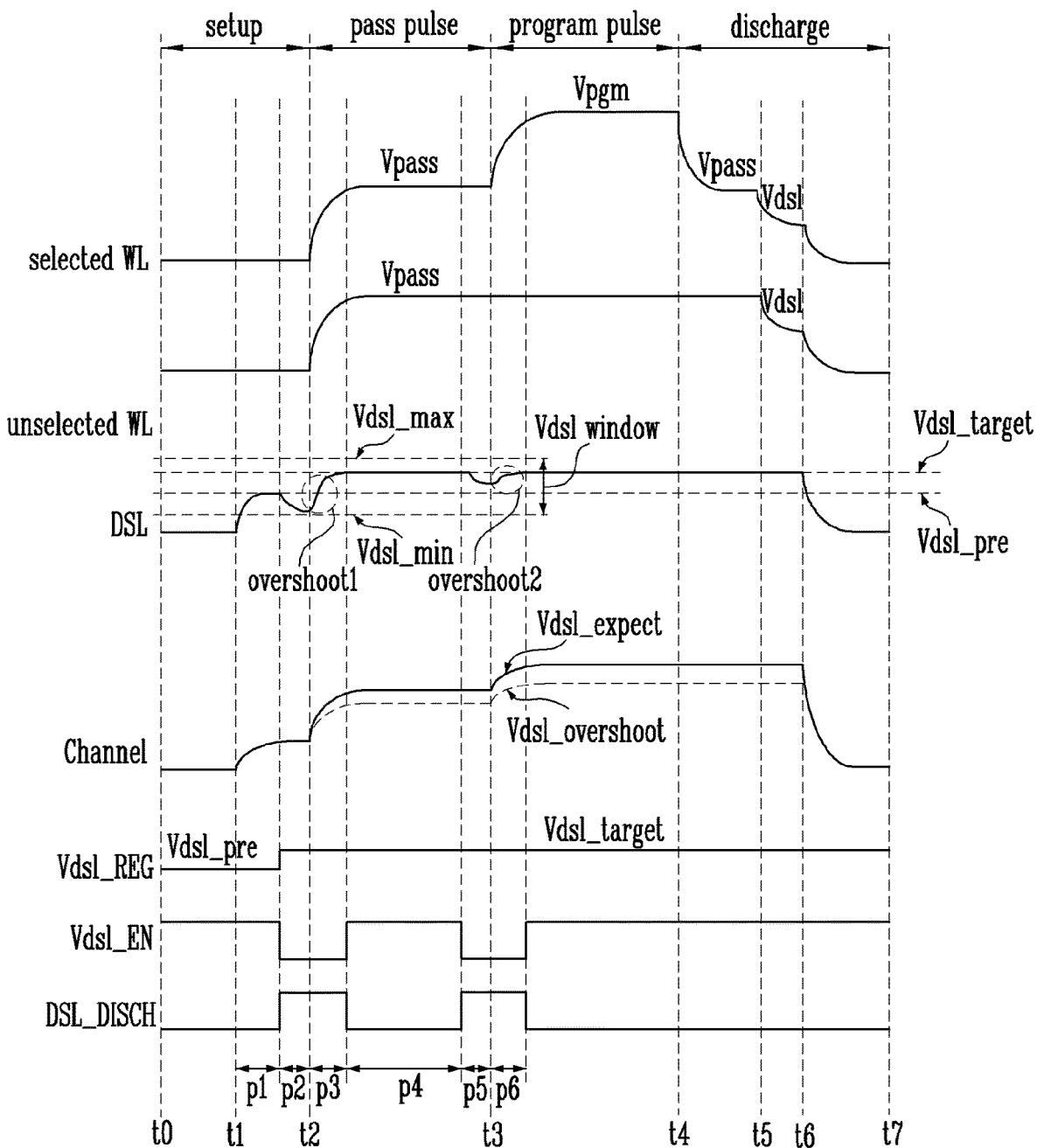
FIG. 7 is a timing diagram for describing the select voltage discharge according to another embodiment of the present disclosure.

FIG. 7 is a timing diagram for describing the select voltage discharge according to another embodiment.

Figure 10:
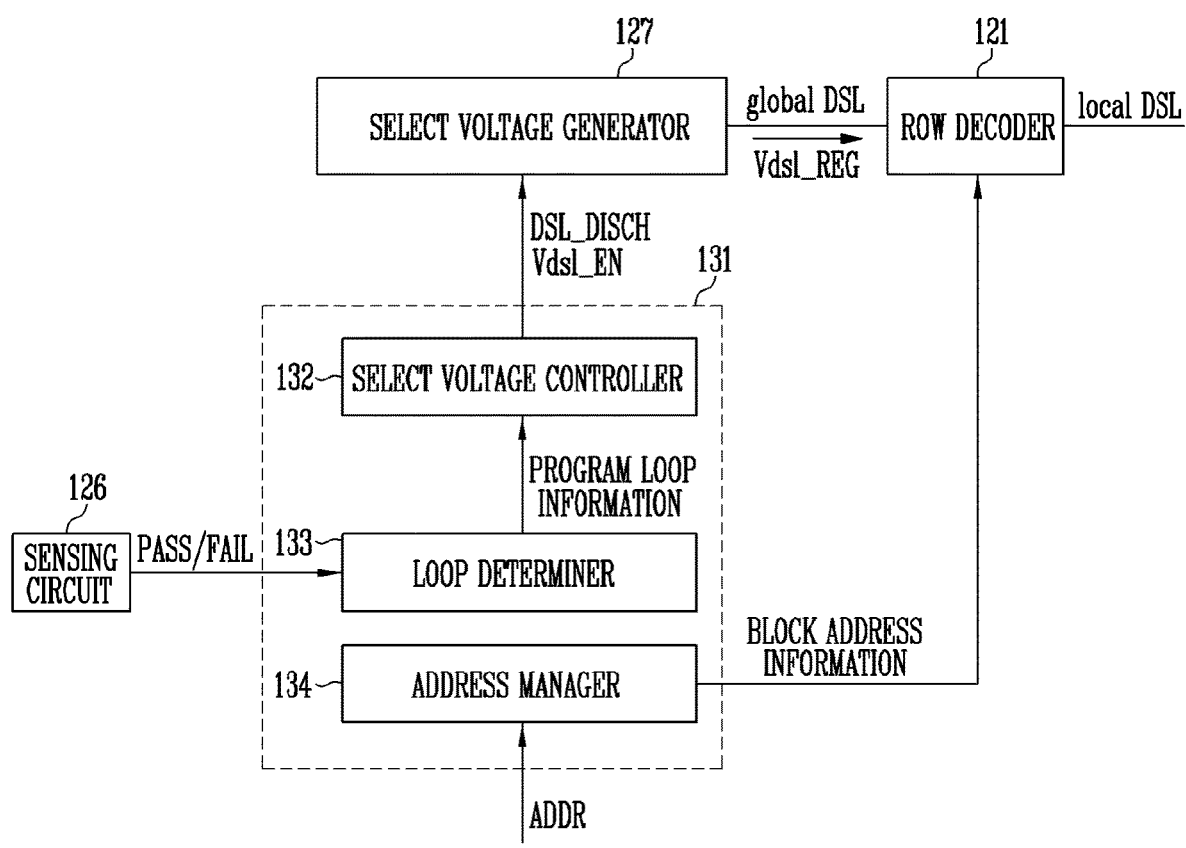
FIG. 10 is a diagram for describing a select voltage manager and a select voltage generator according to an embodiment of the present disclosure.

Referring to FIG. 7, at the first time, t1, an adjustment select voltage Vdsl_REG may have a level of a preselect voltage Vdsl_pre. The adjustment select voltage Vdsl_REG is a voltage output from the select voltage generator 127 as shown in FIG. 10. at the first time, t1, the row decoder 121 transfers the adjustment select voltage Vdsl_REG having a level of the preselect voltage Vdsl_pre to the drain select line DSL. When the preselect voltage Vdsl_pre is applied to the drain select line DSL, a voltage of the channel may be increased as the preselect voltage Vdsl_pre.

When the preselect voltage Vdsl_pre lower than the target select voltage Vdsl_target is applied to the drain select line and the target select voltage Vdsl_target is applied to the drain select line when the overshoot occurs, the target select voltage Vdsl_target may be reached by receiving help of the overshoot. That is, since a voltage level of the drain select line is increased with the help of the overshoot, the voltage level of the drain select line may reach the target select voltage quickly.

When the first period p1 elapses from the first time t1, the adjustment select voltage Vdsl_REG may be increased as the target select voltage Vdsl_target. Therefore, the drain select line DSL may be discharged by activating the drain select line discharge signal DSL_DISCH. That is, during the second period p2 subsequent to the first period p1, the drain select line DSL may be discharged. Specifically, the select voltage applied to the drain select line DSL may decrease to a level higher than the minimum select voltage Vdsl_min. The select voltage manager 131 may control the select voltage to be decreased to a level higher than the minimum select voltage Vdsl_min by adjusting the length of the second period p2 during which the drain select line discharge signal DSL_DISCH is activated.

The select voltage manager 131 may discharge the drain select line during the third period p3 subsequent to the second period p2. However, during the third period p3, the select voltage may be increased by the pass voltage Vpass applied to the word line. That is, the select voltage may be increased by the first overshoot overshoot1. The select voltage manager 131 may control the select voltage to increase to a level lower than the maximum select voltage Vdsl_max by adjusting the length of the third period p3 during which the drain select line discharge signal DSL_DISCH is activated. For example, the select voltage manager 131 may control the length of the third period p3 so that the select voltage reaches the target select voltage Vdsl_target by the overshoot.

Since the pass pulse period, the program pulse period, and the discharge period subsequent to the third period p3 are the same as described with reference to FIG. 7, description thereof is omitted.

FIG. 8A is a diagram for describing a threshold voltage distribution of the drain select transistors connected to the drain select transistor.

FIG. 8B is a diagram for describing a voltage applied to each terminal of the drain select transistor.

Referring to FIG. 8A, threshold voltages of the drain select transistors connected to the drain select line DSL may form a distribution by process, variation, and temperature. The smallest threshold voltage included in the formed distribution may be a minimum threshold voltage Vth_min. The largest threshold voltage included in the formed distribution may be a maximum threshold voltage Vth_max.

Referring to FIG. 8B, the select voltage Vdsl transferred from the drain select line DSL may be applied to a gate of the drain select transistor DST. A bit line voltage Vbl transferred from the bit line may be applied to a bit line side terminal of the drain select transistor DST.

When the string including the drain select transistor is the select string, the program permission voltage may be applied to the bit line. The program permission voltage may be a ground voltage. The ground voltage may be 0V.

When the string including the drain select transistor is the unselected string, the program inhibit voltage may be applied to the bit line. The program inhibit voltage may be the power voltage Vcc.

FIG. 9 is a diagram for describing a method of calculating the select voltage window.

Referring to FIG. 9, during the program mode in which the selected memory cell is programmed, the drain select transistor DST included in the select string including the select memory cell is required to be turned on. Therefore, a difference between the select voltage Vdsl and the bit line voltage Vbl is required to be greater than the maximum threshold voltage Vth_max.

During the program inhibit mode in which the program is inhibited with respect to the unselected memory cell, the drain select transistor DST included in the unselected string including the unselected memory cell is required to be turned off. Therefore, the difference between the select voltage Vdsl and the bit line voltage Vbl is required to be less than the minimum threshold voltage Vth_min.

The select voltage applied to the drain select line in the pass pulse period and the program pulse period is required to be included in the select voltage window so that the memory cell that is in the program mode is programmed and the memory cell that is in the program inhibit mode is not programmed.

As described with reference to FIG. 9, the select voltage window may be in a voltage range that is greater than the maximum threshold voltage Vth_max and less than a sum of the minimum threshold voltage Vth_min and the power voltage Vcc.

For convenience of description, the ground voltage is applied to the bit line during the program mode, but an intermediate voltage Vdpgm having a voltage level between the ground voltage and the power voltage may be applied. In this case, the select voltage window may be a voltage range greater than a sum of the maximum threshold voltage Vth_max and the intermediate voltage dpgm and less than the sum of the minimum threshold voltage Vth_min and the power voltage Vcc.

FIG. 10 is a diagram for describing the select voltage manager and the select voltage generator according to an embodiment of the present disclosure.

Referring to FIG. 10, the select voltage manager 131 may include a select voltage controller 132, a loop determiner 133, and an address manager 134.

The select voltage controller 132 may generate the drain select line discharge signal DSL_DISCH and the select line activation signal Vdsl_EN to be transferred to the select voltage generator 127.

The select voltage generator 127 may transfer the adjustment select voltage Vdsl_REG to the drain select line in response to the select line activation signal Vdsl_EN. The adjustment select voltage Vdsl_REG may be generated by regulating an external power voltage. The adjustment select voltage Vdsl_REG may be transferred to the row decoder 121 through a global drain select line global DSL. The row decoder 121 may transfer the adjustment select voltage Vdsl_REG to any one of a plurality of local drain select lines. That is, the adjustment select voltage Vdsl_REG may be used as the select voltage Vdsl. For example, the adjustment select voltage Vdsl_REG may be the preselect voltage Vdsl_pre or the target select voltage Vdsl_target. That is, the select voltage generator 127 may generate the preselect voltage Vdsl_pre or the target select voltage Vdsl_target by regulating the external voltage. The select voltage generator 127 may transfer the generated preselect voltage Vdsl_pre or target select voltage Vdsl_target to the global drain select line global DSL according to the select line activation signal Vdsl_EN.

The select voltage generator 127 may decrease the select voltage applied to the drain select line DSL in response to the select line discharge signal DSL_DISCH.

The select voltage controller 132 may receive program loop information from the loop determiner 133. The select voltage controller 132 may control a discharge parameter related to the discharge of the drain select line DSL based on the program loop information. The discharge parameter may be a discharge time during which the drain select line is discharged or a discharge speed at which the drain select line is discharged.

The select voltage controller 132 may determine the discharge time for discharging the drain select line DSL based on the program loop information. As the program loop is progressed, a greater operation voltage is applied to the word line, and thus a greater overshoot may occur in the drain select line. Therefore, the select voltage controller 132 may increase the discharge time for discharging the drain select line DSL as the program loop progresses.

For example, the select voltage controller 132 may determine the lengths of the second period p2 and the third period p3 described with reference to FIGS. 6 and 7. The select voltage controller 132 may transfer the drain select line discharge signal DSL_DISCH to the select voltage generator 127 during the determined second period p2 and third period p3.

The select voltage controller 132 may determine the speed at which the drain select line DSL is discharged based on the program loop information. As the program loop progresses, a greater operation voltage is applied to the word line, and thus a greater overshoot may occur in the drain select line. Therefore, the select voltage controller 132 may control the speed at which the drain select line DSL is discharged to increase as the program loop progresses. That is, the select voltage controller 132 may provide a plurality of drain select line discharge signals to the select voltage generator 127, and the select voltage generator 127 may control the speed at which the drain select line DSL is discharged, by using a plurality of discharge circuits.

The loop determiner 133 may manage the program loop information for the program loop that is currently performed. For example, the program loop information may include one of a magnitude of the pass voltage, a magnitude of the program voltage, and the number of program loops. The loop determiner 133 may receive the pass signal PASS or the fail signal FAIL for the program operation from the sensing circuit 126 and increase the number of program loops. The number of program loops may indicate the number of times the program voltage or the verify voltage is applied to the word line. The loop determiner 133 may determine the magnitude of the program voltage or the magnitude of the pass voltage applied to the word line based on the number of program loops. For convenience of description, the loop determiner 133 determines the program loop information based on the pass signal or the fail signal received from the sensing circuit 126. However, the loop determiner 133 may increase the number of program loops according to whether a clock signal is toggled a predetermined number of times. Alternatively, the loop determiner 133 may increase the number of program loops when the number of times the program voltage or the verify voltage is applied to the word line, increases. An embodiment of the present disclosure is not limited thereto, and the loop determiner 133 may generate the program loop information including the number of program loops performed to the present, the magnitude of the pass voltage applied to the word line, or the magnitude of the program voltage, and transfer the program loop information to the select voltage controller 132.

The select voltage controller 132 may control the select voltage generator 127 by activating the drain select line activation signal Vdsl_EN based on the program loop information.

The address manager 134 may receive the address ADDR from the input/output circuit 125. The address manager 134 may generate block address information based on the address ADDR and transfer the block address information to the row decoder 121.

The row decoder 121 may select any one of the plurality of memory blocks included in the memory cell array 110 based on the block address information. The row decoder 121 may provide the adjustment select voltage Vdsl_REG received from the select voltage generator 127 to the local drain select line local DSL connected to the selected memory block.

Figure 11:
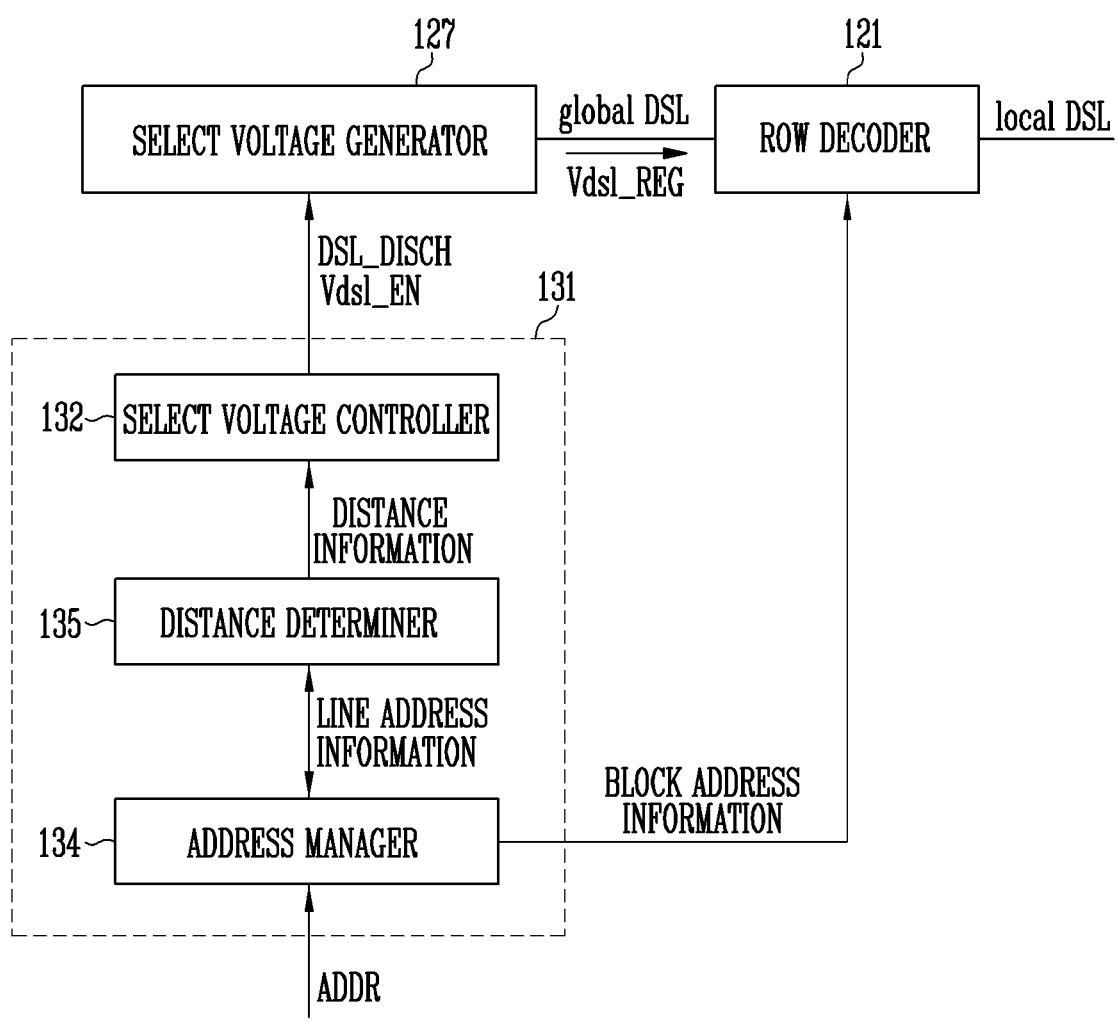
FIG. 11 is a diagram for describing the select voltage manager and the select voltage generator according to another embodiment of the present disclosure.

FIG. 11 is a diagram for describing the select voltage manager and the select voltage generator according to another embodiment.

Referring to FIG. 11, the select voltage manager 131 may include a line distance determiner 135. The line distance determiner 135 may receive line address information from the address manager 134. The line address information may include selected word line address information indicating a position of the selected word line and drain select line address information indicating a position of the drain select line.

The line distance determiner 135 may generate distance information indicating a distance between the drain select line and the selected word line based on the line address information. The line distance determiner 135 may provide the generated distance information to the select voltage controller 132.

The select voltage controller 132 may control the discharge parameter related to the discharge of the drain select line DSL based on the distance information. The discharge parameter may be the discharge time during which the drain select line is discharged or the discharge speed at which the drain select line is discharged.

As the distance between the selected word line and the drain select line decreases, a size of the overshoot that occurs in the drain select line may increase. Therefore, the select voltage controller 132 may increase the discharge time or the discharge speed when the distance between the drain select line DSL and the selected word line decreases. The select voltage controller 132 may decrease the discharge time or the discharge speed when the distance between the drain select line DSL and the selected word line increases.

Figure 12:
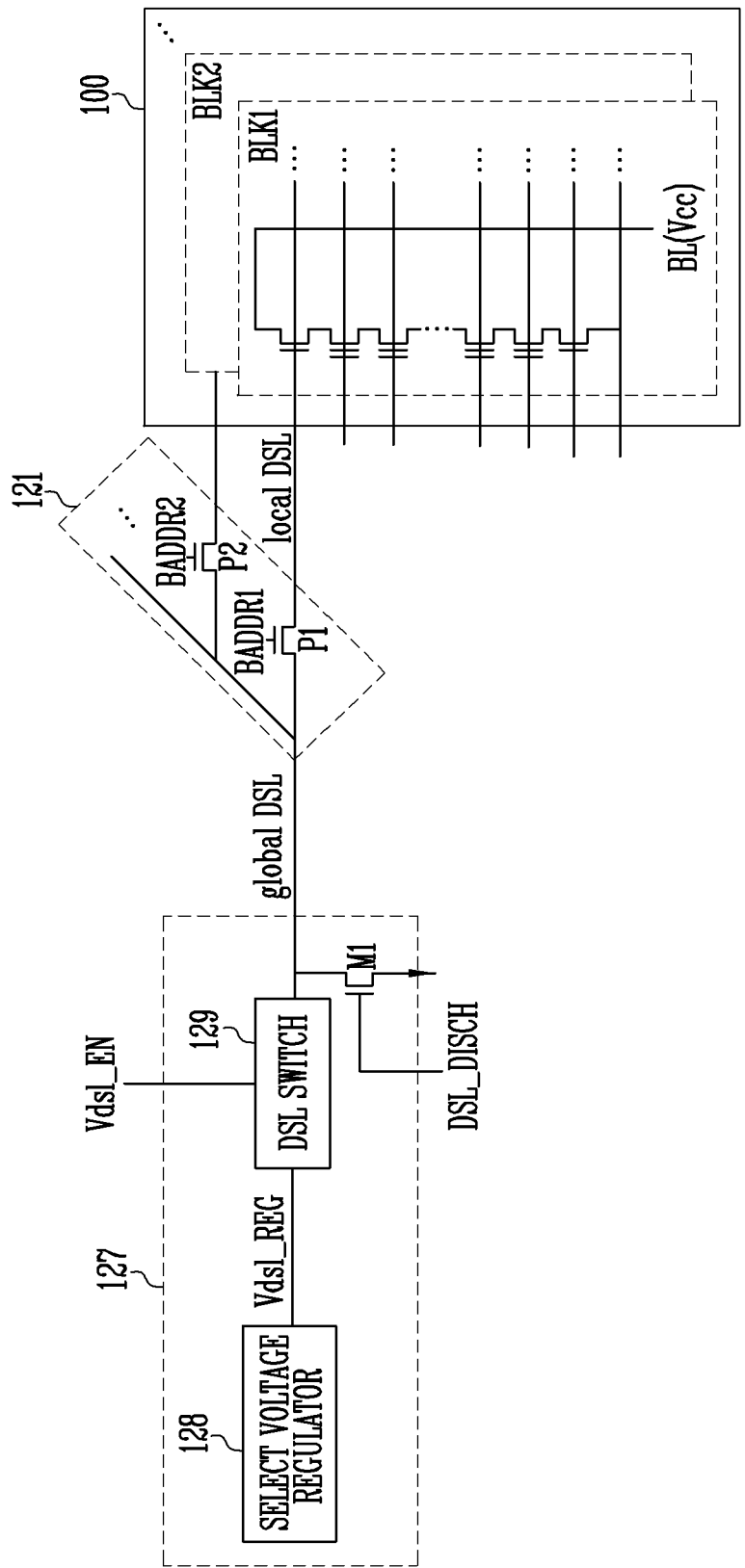
FIG. 12 is a diagram for describing a structure of the select voltage generator according to an embodiment of the present disclosure.

FIG. 12 is a diagram for describing a structure of the select voltage generator according to an embodiment of the present disclosure.

Referring to FIG. 12, the select voltage generator 127 may include a select voltage regulator 128, a drain select line switch 129, and a discharge circuit M1.

The select voltage regulator 128 may generate the adjustment select voltage Vdsl_REG by regulating an external voltage. The adjustment select voltage Vdsl_REG may be the preselect voltage Vdsl_pre. The adjustment select voltage Vdsl_REG may be the target select voltage Vdsl_target.

The drain select line switch 129 may selectively transfer the adjustment select voltage Vdsl_REG to the global drain select line global DSL in response to the drain select line activation signal Vdsl_EN. Specifically, when the drain select line activation signal Vdsl_EN is activated, the adjustment select voltage Vdsl_REG may be transferred to the global drain select line global DSL, and when the drain select line activation signal Vdsl_EN is inactivated, the adjustment select voltage Vdsl_REG may not be transferred to the global drain select line global DSL.

The discharge circuit M1 may discharge the drain select line in response to the drain select line discharge signal DSL_DISCH.

The row decoder 121 may transfer the adjustment select voltage Vdsl_REG transferred through the global drain select line global DSL to the plurality of local drain select lines. The local drain select lines may be connected to different memory blocks. For example, the row decoder 121 may provide the adjustment select voltage to any one of a local drain select line connected to a first memory block BLK1 and a local drain select line connected to a second memory block BLK2.

Specifically, the row decoder 121 may turn on any one of a plurality of pass transistors based on the block address information received from the address manager 134. That is, the row decoder 121 may provide the select voltage to the local drain select line connected to the memory block to be programmed. For example, the adjustment select voltage Vdsl_REG may be provided to the local drain select line connected to the first block BLK1 through a first block address signal BADDR1.

The select voltage manager 131 may control the discharge time by adjusting a time period during which the drain select line activation signal Vdsl_EN and the drain select line discharge signal DSL_DISCH are activated.

The select voltage manager 131 may adjust the time during which the drain select line activation signal Vdsl_EN and the drain select line discharge signal DSL_DISCH are activated based on the distance information between the selected word line and the drain select line or the program loop information.

The select voltage manager 131 may adjust the time period during which the drain select line activation signal Vdsl_EN and the drain select line discharge signal DSL_DISCH are activated so that the discharge time increases as the distance between the selected word line and the drain select line decreases.

The select voltage manager 131 may adjust the time during which the drain select line activation signal Vdsl_EN and the drain select line discharge signal DSL_DISCH are activated so that the discharge time increases as the number of program loops increases. Alternatively, the select voltage manager 131 may adjust the time during which the drain select line activation signal Vdsl_EN and the drain select line discharge signal DSL_DISCH are activated so that the discharge time increases as the magnitude of the pass voltage or the magnitude of the program voltage increases.

That is, the select voltage manager 131 may control the select voltage generator 127 to discharge the drain select line for a longer time as the size of the overshoot generated in the drain select line increases.

Figure 13:
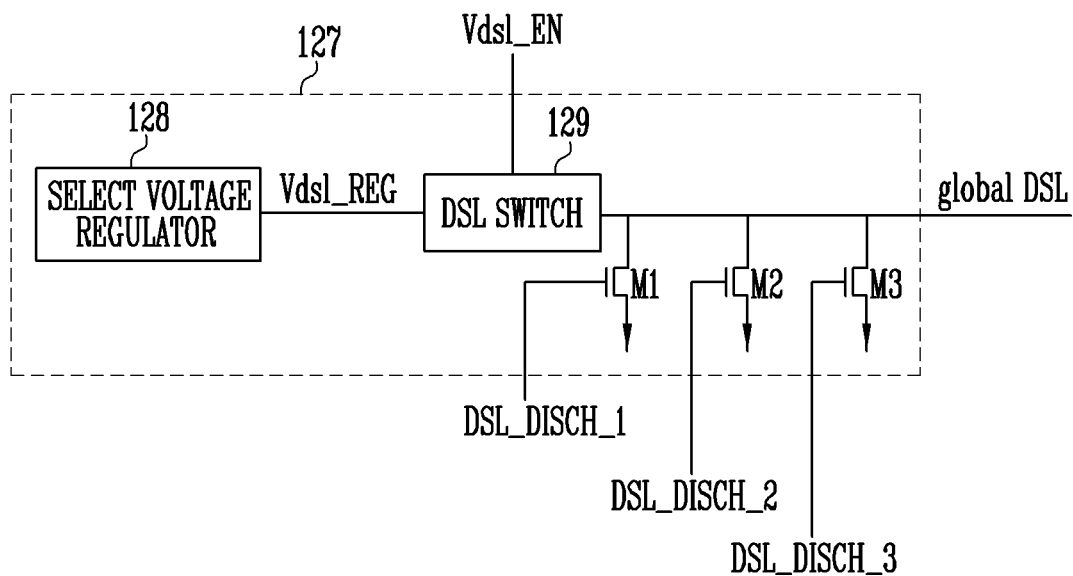
FIG. 13 is a diagram for describing the structure of the select voltage generator according to another embodiment of the present disclosure.

FIG. 13 is a diagram for describing the structure of the select voltage generator according to another embodiment of the present invention.

Referring to FIG. 13, the select voltage generator 127 may include a plurality of discharge circuits M1 to M3. The plurality of discharge circuits M1 to M3 may discharge the drain select line in response to drain select line discharge signals DSL_DISCH_1 to DSL_DISCH_3.

The select voltage manager 131 may selectively activate the drain select line discharge signals DSL_DISCH_1 to DSL_DISCH_3 based on the distance information between the selected word line and the drain select line or the program loop information. The select voltage manager 131 may selectively activate the drain select line discharge signals DSL_DISCH_1 to DSL_DISCH_3 to adjust the discharge speed.

The select voltage manager 131 may control the select voltage generator 127 to increase the discharge speed as the distance between the selected word line and the drain select line decreases. Specifically, the select voltage manager 131 may control the drain select line discharge signals to be activated as the distance between the selected word line and the drain select line decreases.

The select voltage manager 131 may control the select voltage generator 127 to increase the discharge speed as the number of program loops increases. Specifically, the select voltage manager 131 may control the drain select line discharge signals to be activated as the number of program loops increases. Alternatively, the select voltage manager 131 may control the select voltage generator 127 to increase the discharge speed as the magnitude of the pass voltage or the magnitude of the program voltage increases. Specifically, the select voltage manager 131 may control the drain select line discharge signals to be activated as the magnitude of the pass voltage or the magnitude of the program voltage increases.

That is, the select voltage manager 131 may control activating more drain select line discharge signals as the size of overshoot generated in the drain select line increases.

The method of adjusting the discharge speed by the select voltage manger 131 has been described. However, the select voltage manager 131 may adjust the discharge time by adjusting an activation time of the drain select line discharge signals DSL_DISCH_1 to DSL_DISCH_3.

Figure 14:
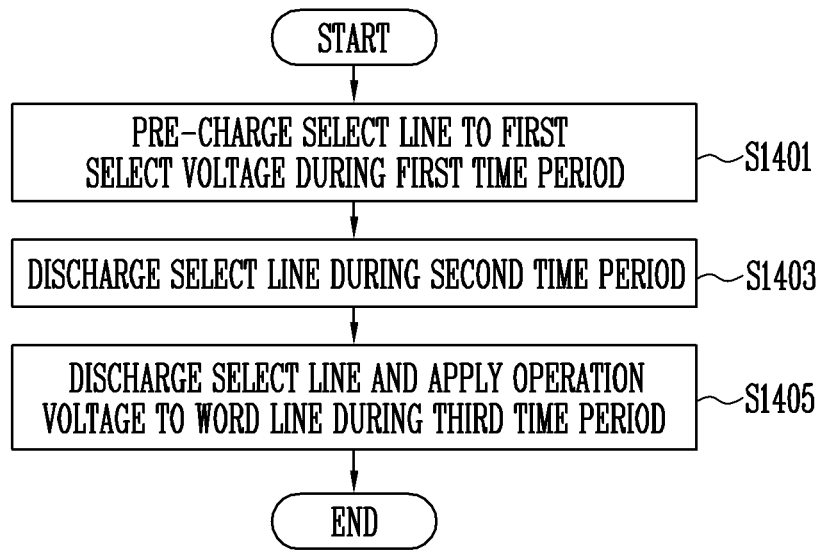
FIG. 14 is a flowchart for describing a method of operating the memory device according to an embodiment of the present disclosure.

FIG. 14 is a flowchart for describing a method of operating the memory device according to an embodiment of the present disclosure.

Referring to FIG. 14, in step S1401, the select voltage manager 131 may control the select voltage generator 127 to pre-charge the drain select line connected to the drain select transistor to a first select voltage during a first time period. Specifically, the select voltage manager 131 may control the select voltage generator 127 to pre-charge the drain select line to the first select voltage by activating the drain select line activation signal Vdsl_EN and inactivating the drain select line discharge signal DSL_DISCH. The first select voltage may be the preselect voltage Vdsl_pre or the target select voltage Vdsl_target.

In step S1403, the select voltage manager 131 may control the select voltage generator 127 to discharge the drain select line connected to the drain select transistor during the second time period subsequent to the first time period.

In step S1405, the select voltage manager 131 may control the select voltage generator 127 to discharge the drain select line connected to the drain select transistor when the operation voltage is applied to the word line connected to the plurality of memory cells during a third time period subsequent to the second time period.

The select voltage manager 131 may determine the discharge parameter related to the discharge of the select line before discharging the select line during the second time period or the third time period. The discharge parameter may be the discharge speed at which the select line is discharged or the discharge time during which the select line is discharged.

FIG. 15 is a flowchart for describing a method of determining the discharge parameter according to an embodiment of the present disclosure.

Referring to FIG. 15, in step S1501, the select voltage manager 131 may control the select voltage generator 127 to pre-charge the drain select line connected to the drain select transistor to the first select voltage during the first time period.

In step S1503, the select voltage manager 131 may obtain the distance information between the selected memory cell and the select transistor. Since the method of obtaining the distance information has been described with reference to FIG. 11, description thereof is omitted.

In step S1505, the select voltage manager 131 may determine the discharge parameter of the second time period or the third time period based on the distance information. The discharge parameter may be the length of the second time period or the third time period, that is, the discharge time. The discharge time may be adjusted by the select line activation signal Vdsl_EN and the drain select line discharge signal DSL_DISCH. The discharge parameter may be the discharge speed at which the select line is discharged in the second time period and the third time period. The discharge speed may be adjusted by controlling the drain select line discharge signals DSL_DISCH_1 to DISH_DISCH_3 applied to the plurality of discharge circuits M1 to M3 as shown in FIG. 13. Since the method of determining the discharge parameter based on the distance information has been described with reference to FIGS. 11 to 13, description thereof is omitted.

In step S1507, the select voltage manager 131 may control the select voltage generator 127 to discharge the drain select line during the second time period or the third time period according to the discharge parameter. The select voltage manager 131 may control the select voltage generator 127 to increase the discharge time or the discharge speed as the distance between the selected word line and the drain select line or the distance between the selected memory cell and the select transistor decreases.

FIG. 16 is a flowchart for describing the method of determining the discharge parameter according to an embodiment of the present disclosure.

Referring to FIG. 16, in step S1601, the select voltage manager 131 may control the select voltage generator 127 to pre-charge the drain select line connected to the drain select transistor to the first select voltage during the first time period.

In step S1603, the select voltage manager 131 may obtain the program loop information related to the program loop that is currently performed. Since the method of obtaining the program loop information has been described with reference to FIG. 10, description thereof is omitted.

In step S1605, the select voltage manager 131 may determine the discharge parameter of the second time period or the third time period based on the program loop information. The discharge parameter may be the length of the second time period or the third time period. The discharge parameter may be the speed at which the select line is discharged in the second time period and the third time period. Since the method of determining the discharge parameter based on the program loop information has been described with reference to FIGS. 10, 12, and 13, description thereof is omitted.

In step S1607, the select voltage manager 131 may control the select voltage generator 127 to discharge the drain select line during the second time period or the third time period according to the discharge parameter. The select voltage manager 131 may control the select voltage generator 127 to increase the discharge time or the discharge speed as the number of program loops increases.

Figure 17:
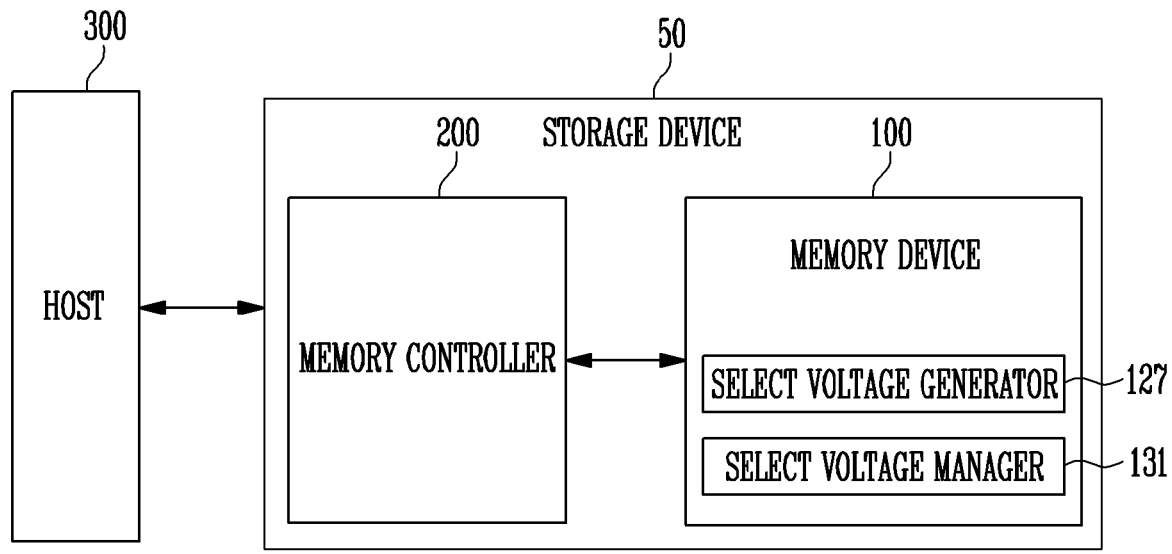
FIG. 17 is a block diagram for describing a storage device.

FIG. 17 is a block diagram for describing a storage device.

Referring to FIG. 17, the storage device 50 may include a memory device 100 and a memory controller 200 that controls an operation of the memory device.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, the memory device 100 is a NAND flash memory.

The memory device 100 may receive a command and an address from the memory controller 200. The memory device 100 is configured to access an area selected by the received address of the memory cell array. Accessing the selected area means performing an operation corresponding to the received command on the selected area. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

In an embodiment, the memory device 100 may include the select voltage generator 127 and the select voltage manager 131. The select voltage generator 127 may generate the select voltage to be applied to the select line. In order to resolve a phenomenon in which a channel boosting level is decreased due to the overshoot occurring in the select line, the select voltage manager 131 may control the select voltage during the program operation.

Specifically, when the operation voltage is applied to the word line, the overshoot may occur in which the voltage applied to the select line increases due to a coupling phenomenon between the word line and the select line. When the overshoot occurs, the select transistor included in the unselected cell string may be turned on, and a leakage current flowing from the channel formed by the memory cells included in the unselected cell string to the bit line may be generated. Therefore, a channel boosting level may be decreased. Since a difference between the operation voltage and the channel boosting level is increased when the channel boosting level is decreased, program disturb in which the memory cell of the program inhibit mode is programmed by the operation voltage may occur.

Therefore, the select voltage manager 131 may prevent the program disturb by controlling the select voltage generator 127 to discharge the voltage applied to the select line during a predetermined time period determined based on the timing at which the operation voltage is applied to the word line.

When power is applied to the storage device 50, the memory controller 200 may execute firmware (FW). The firmware FW may include a host interface layer HIL that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receives the response from the memory device 100.

The memory controller 200 may receive data and a logical address (LA) from the host 300, and may convert the logical address into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation by itself regardless of the request from the host 300. For example, the memory controller 200 may control the memory device 100 to perform the program operation, the read operation, or the erase operation used to perform a background operation such as wear leveling, garbage collection, or read reclaim.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a non-volatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 18:
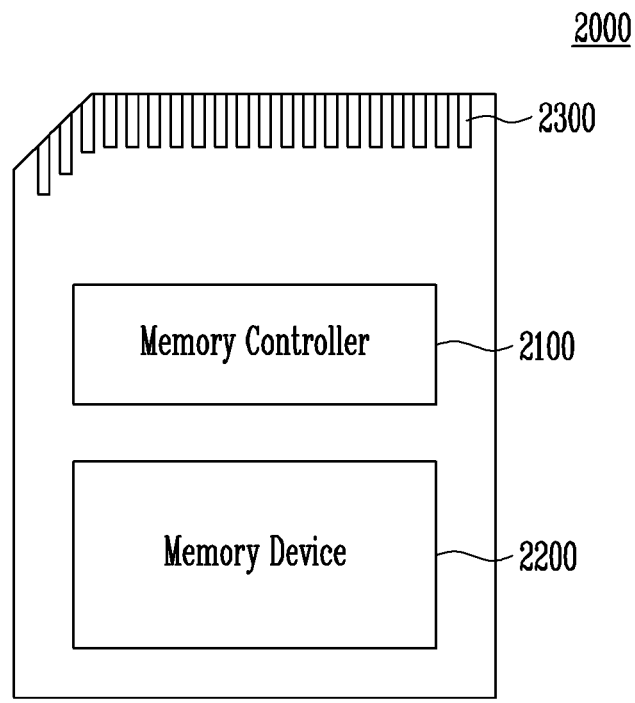
FIG. 18 is a block diagram illustrating a memory card system to which the storage device according to an embodiment of the present disclosure is applied.

FIG. 18 is a block diagram illustrating a memory card system to which the storage device according to an embodiment of the present disclosure is applied.

Referring to FIG. 18, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 described with reference to FIG. 1.

For example, the memory controller 2100 may include components such as a random-access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 19:
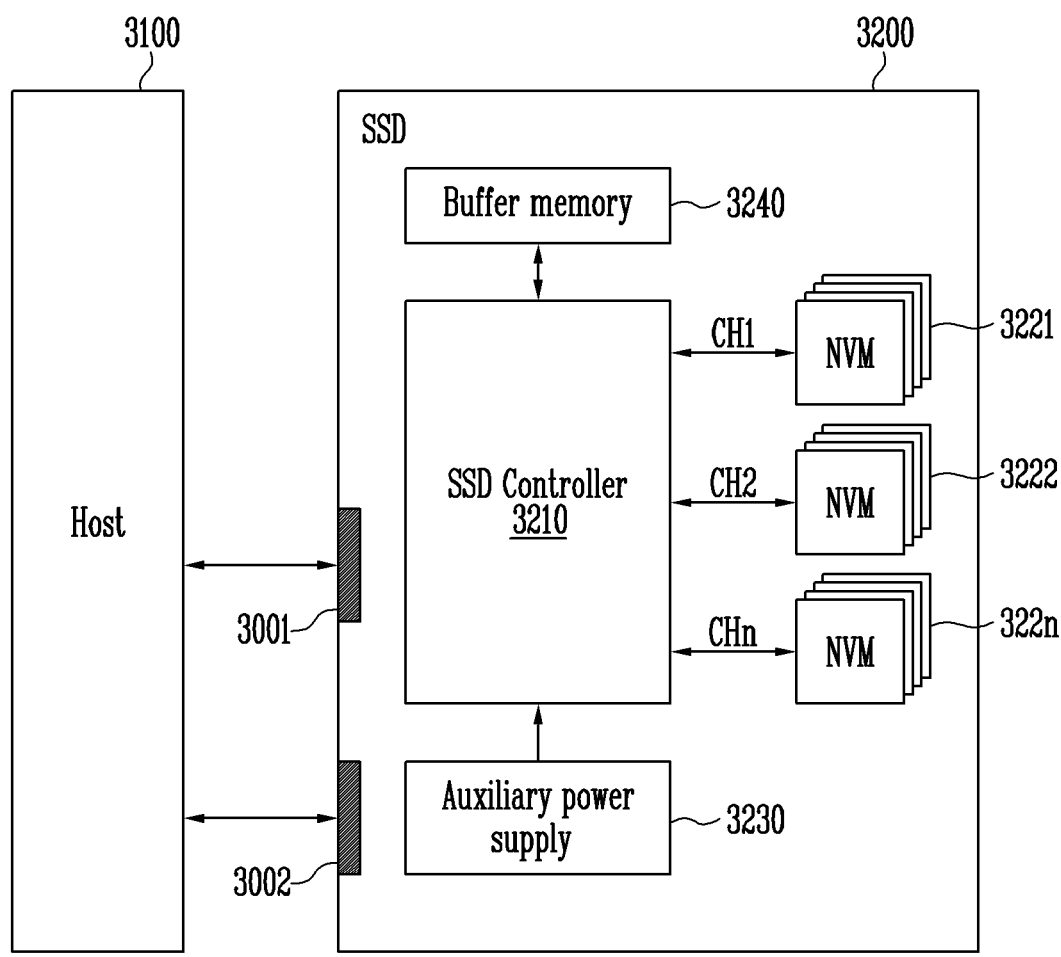
FIG. 19 is a block diagram illustrating a solid-state drive (SSD) system to which a storage device according to an embodiment of the present disclosure is applied.

FIG. 19 is a block diagram illustrating a solid-state drive (SSD) system to which the storage device according to an embodiment of the present disclosure is applied.

Referring to FIG. 19, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power for the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 20:
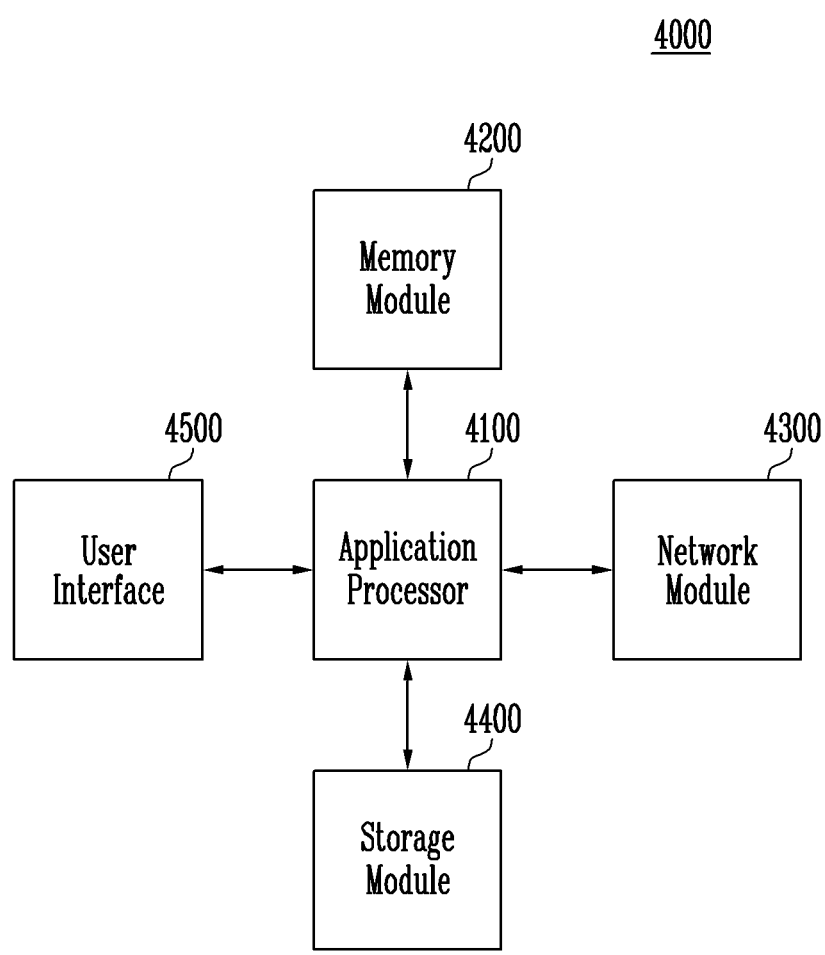
FIG. 20 is a block diagram illustrating a user system to which the storage device according to an embodiment of the present disclosure is applied.

FIG. 20 is a block diagram illustrating a user system to which the storage device according to an embodiment of the present disclosure is applied.

Referring to FIG. 20, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

The storage module 4400 may operate identically to the storage device 50 described with reference to FIG. 17.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A method of operating a memory device including a cell string including a select transistor and a plurality of memory cells, the method comprising:
   pre-charging a select line connected to the select transistor to a first select voltage during a first time period;
   discharging the select line during a second time period subsequent to the first time period; and
   discharging the select line while word lines connected to the plurality of memory cells are pre-charged to an operation voltage in a third time period subsequent to the second time period to change a level of the first select voltage pre-charged to the select line to a second select voltage.

2. The method of claim 1, further comprising:
   obtaining distance information between a selected memory cell among the plurality of memory cells and the select transistor before discharging the select line during the second time period; and
   determining a length of the second time period or the third time period based on the distance information.

3. The method of claim 2, wherein determining the second time period or the third time period comprises increasing the length of the second time period or the third time period as a distance between the selected memory cell and the select transistor is reduced.

4. The method of claim 2, further comprising determining a discharge speed at which the select line is discharged in the second time period or the third time period based on the distance information.

5. The method of claim 4, wherein determining the discharge speed comprises increasing the speed at which the select line is discharged in the second time period or the third time period as the distance between the selected memory cell and the select transistor is reduced.

6. The method of claim 1, further comprising:
obtaining program loop information related to a program loop that is currently performed on the plurality of memory cells before discharging the select line during the second time period; and
determining a length of the second time period or the third time period based on the program loop information.

7. The method of claim 6, wherein the program loop information is the number of performed program loops, a magnitude of a pass voltage applied to a word line, or a magnitude of a program voltage applied to the word line.

8. The method of claim 7, further comprising determining a speed at which the select line is discharged in the second time period or the third time period based on the program loop information.

9. The method of claim 1, wherein a select voltage, applied to the select line during the second time period and the third time period, is greater than a threshold voltage of the select transistor, and is less than a sum of a program inhibit voltage applied to a bit line connected to the cell string and a threshold voltage of the select transistor.

10. The method of claim 1, further comprising blocking a supply of the first select voltage provided to the select line while the select line is discharged in the second time period and the third time period.

11. A memory device comprising:
a cell string including a select transistor and a plurality of memory cells;
a peripheral circuit configured to perform a program operation on a selected memory cell among the plurality of memory cells; and
a control logic configured to control the peripheral circuit so that a select line connected to the select transistor is discharged while a word line connected to the plurality of memory cells is pre-charged to an operation voltage during the program operation.

12. The memory device of claim 11, wherein the control logic comprises a select voltage manager configured to determine a speed at which the select line is discharged or a time during which the select line is discharged.

13. The memory device of claim 12, wherein the select voltage manager comprises:
a distance determiner configured to obtain distance information between a selected word line connected to the selected memory cell and the select line; and
a select voltage controller configured to determine the speed at which the select line is discharged or the time during which the select line is discharged, based on the distance information.

14. The memory device of claim 13, wherein the select voltage controller increases the speed at which the select line is discharged or the time during which the select line is discharged as a distance between the selected word line and the select line is reduced.

15. The memory device of claim 14,
wherein the peripheral circuit comprises a plurality of discharge circuits each generating a path, through which the select voltage applied to the select line is discharged, and each turned on according to control of the control logic, and
wherein the select voltage controller controls the plurality of discharge circuits so that more discharge circuits are turned on as the distance between the selected word line and the select line is reduced.

16. The memory device of claim 12, wherein the select voltage manager comprises:
a loop determiner configured to obtain program loop information related to a program loop that is currently performed on the plurality of memory cells; and
a select voltage controller configured to determine a speed at which the select line is discharged or a time during which the select line is discharged based on the program loop information.

17. The memory device of claim 16, wherein the program loop information is a magnitude of a pass voltage, a magnitude of a program voltage, or the number of program loops.

18. The memory device of claim 17, wherein the select voltage controller increases the speed at which the select line is discharged or the time during which the select line is discharged as the magnitude of the pass voltage, the magnitude of the program voltage, or the number of program loops increases.

19. The memory device of claim 18,
wherein the peripheral circuit comprises a plurality of discharge circuits each generating a path through which the select voltage applied to the select line is discharged, and each turned on according to control of the control logic, and
wherein the select voltage controller controls the plurality of discharge circuits so that more discharge circuits are turned on as the magnitude of the pass voltage, the magnitude of the program voltage, or the number of program loops increases.

20. The memory device of claim 11,
wherein the peripheral circuit comprises:
a select voltage regulator configured to generate an adjustment select voltage regulated from an external power voltage; and
a select line switch configured to selectively transfer the adjustment select voltage to the select line,
wherein the select line switch blocks the adjustment select voltage provided to the select line while a word line connected to the plurality of memory cells is pre-charged to an operation voltage.

* * * * *